United States Patent
Song et al.

(10) Patent No.: US 9,478,541 B2
(45) Date of Patent: Oct. 25, 2016

(54) HALF NODE SCALING FOR VERTICAL STRUCTURES

(71) Applicant: QUALCOMM Incorporated, San Diego, CA (US)

(72) Inventors: Stanley Seungchul Song, San Diego, CA (US); Kern Rim, San Diego, CA (US); Jeffrey Junhao Xu, San Diego, CA (US); Matthew Michael Nowak, San Diego, CA (US); Choh Fei Yeap, San Diego, CA (US); Roawen Chen, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 150 days.

(21) Appl. No.: 14/480,156

(22) Filed: Sep. 8, 2014

(65) Prior Publication Data
US 2016/0071847 A1    Mar. 10, 2016

(51) Int. Cl.
| G06F 17/50 | (2006.01) |
| H01L 27/088 | (2006.01) |
| G03F 7/00 | (2006.01) |
| H01L 21/8234 | (2006.01) |
| H01L 27/02 | (2006.01) |

(52) U.S. Cl.
CPC ............ *H01L 27/0886* (2013.01); *G03F 7/00* (2013.01); *G06F 17/5068* (2013.01); *H01L 21/823431* (2013.01); *H01L 27/0207* (2013.01)

(58) Field of Classification Search
CPC ...................................................... G06F 17/50
USPC .......................................................... 716/55
See application file for complete search history.

(56) References Cited

U.S. PATENT DOCUMENTS

| 7,783,995 | B2 | 8/2010 | Joshi |
| 8,423,941 | B2 | 4/2013 | Heng et al. |
| 8,504,965 | B2 | 8/2013 | Liu et al. |
| 8,671,367 | B2 | 3/2014 | Wang et al. |
| 2006/0286754 | A1 | 12/2006 | Hosomi |
| 2012/0045721 | A1 | 2/2012 | Printz et al. |
| 2013/0126978 | A1* | 5/2013 | Becker ............... H01L 27/092 257/369 |
| 2013/0140638 | A1 | 6/2013 | Dixit |
| 2013/0263077 | A1 | 10/2013 | Baek et al. |
| 2014/0245248 | A1 | 8/2014 | Yang et al. |

FOREIGN PATENT DOCUMENTS

| WO | 2008059440 A2 | 5/2008 |
| WO | 2008109324 A1 | 9/2008 |

OTHER PUBLICATIONS

Torres, J. Andres, et al., "Challenges for the 28nm half node: Is the optical shrink dead?," Photomask Technology 2009 (Proceedings SPIE vol. 7488), 7 pages.
International Search Report and Written Opinion—PCT/US2015/040634—ISAEPO—Oct. 19, 2015.

* cited by examiner

*Primary Examiner* — Thuan Do
(74) *Attorney, Agent, or Firm* — Seyfarth Shaw LLP

(57) ABSTRACT

A method for half-node scaling a circuit layout in accordance with an aspect of the present disclosure includes vertical devices on a die. The method includes reducing a fin pitch and a gate pitch of the vertical devices on the die. The method also includes scaling a wavelength to define at least one reduced area geometric pattern of the circuit layout.

20 Claims, 9 Drawing Sheets

500

| | N10 before half-node scaling | | N10 after half-node scaling | |
|---|---|---|---|---|
| | SIZE (nm) | WAVELENGTH/ PROCESS | SIZE (nm) | WAVELENGTH/ PROCESS |
| Fin pitch | 32 | 193i SAQP+cut^2 | 29 (0.9X) | 193i SAQP+cut^2 |
| Fin height | 35 | | 35 | |
| CPP | 64 | 193i SADP+cut | 58 (0.9X) | 193i SADP+cut |
| Lg | 20 | | 20 | |
| MD1 | 64 | 193i LE^3 | 58 (0.9X) | EUV SE |
| MP | 64 | 193i LE^2 | 58 (0.9X) | 193i LE^2 |
| MD2 | 64 | 193i LE^2~3 | 58 (0.9X) | EUV SE |
| V0 | 64 | 193i LE^3~4 | 58 (0.9X) | EUV SE |
| M1 | 42, M1H | 193i SADP+cut^2 | 38, M1H (0.9X) | EUV SE |
| 1xM | 42, M2V | 193i SADP+cut | 38, M2V (0.9X) | EUV SE |

HALF NODE SCALING FOR VERTICAL STRUCTURES

BACKGROUND

1. Field

Aspects of the present disclosure relate to semiconductor devices, and more particularly to half-node scaling for vertical structures.

2. Background

As integrated circuit (IC) technology advances, device geometries are reduced. Between major "full-node" technology transitions, device designers utilize device reduction within a mature technology node. Such device size reductions may be called "half-node" scaling.

In half-node scaling, the area of a device on a chip is reduced in two dimensions, (i.e., x and y) by a certain amount. The half-node scaled version occupies less die area and thus more copies of the IC can be produced for each wafer. This reduces costs because additional devices are produced without changing the layout design, and the original device models may be used to model the reduced-size circuit.

However, with vertical structures, such as fin-structured field-effect transistors (FinFETs), reducing the height (z) of the fin structure would require a new simulation model. As such, half-node scaling is avoided in vertical structure designs. Further, even planar designs may have portions of the devices, such as interconnect line traces, which are at the limit of the lithography processes for a given node. Half-node scaling of such devices would require new layouts and offset cost savings available in half-node scaling processes.

SUMMARY

A method for half-node scaling a circuit layout may include vertical devices on a die. The method includes reducing a fin pitch and a gate pitch of the vertical devices on the die. The method also includes scaling a wavelength to define at least one reduced area geometric pattern of the circuit layout.

A half-node scaled circuit layout on a die in accordance with another aspect of the present disclosure includes vertical devices having a first fin pitch and a first gate pitch. The layout also includes means for selectively conducting current within a reduced area geometric pattern in the half-node scaled circuit layout.

A computer program product for fabricating a half-node scaled circuit layout on a die may include a non-transitory computer readable medium having program code. The program code includes program code to reduce a fin pitch and a gate pitch of the vertical devices on the die. The program code also includes program code to scale a wavelength to define at least one reduced area geometric pattern of the circuit layout.

A half-node scaled circuit layout on a die in accordance with another aspect of the present disclosure includes vertical devices having a first fin pitch and a first gate pitch. The layout also includes at least one device within a reduced area geometric pattern in the half-node scaled circuit layout.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 5 and 6 illustrate half-node scaled designs within aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Semiconductor fabrication processes are often divided into three parts: a front end of line (FEOL), a middle of line (MOL) and a back end of line (BEOL). Front end of line processes include wafer preparation, isolation, well formation, gate patterning, spacers, and dopant implantation. A middle of line process includes gate and terminal contact formation. The gate and terminal contact formation of the middle of line process, however, is an increasingly challenging part of the fabrication flow, particularly for lithography patterning. Back end of line processes include forming interconnects and dielectric layers for coupling to the FEOL devices. These interconnects may be fabricated with a dual damascene process using plasma-enhanced chemical vapor deposition (PECVD) deposited interlayer dielectric (ILD) materials.

Figure 1:
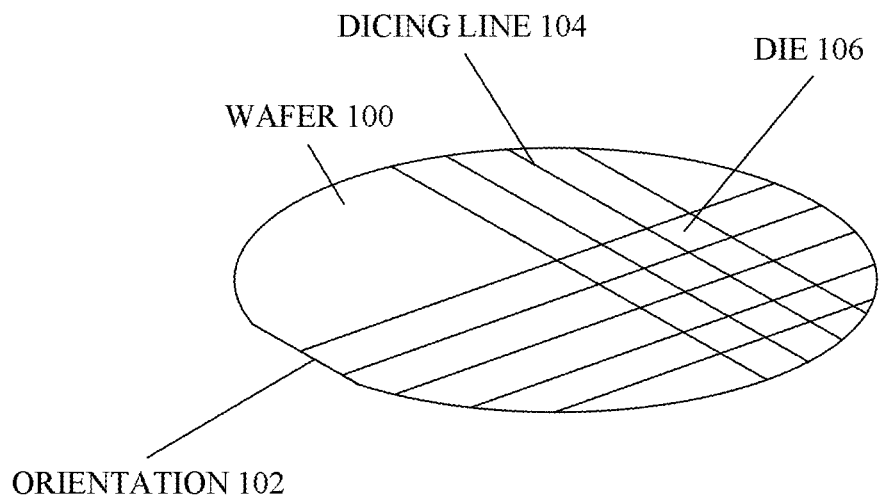
FIG. 1 illustrates a perspective view of a semiconductor wafer in an aspect of the present disclosure.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a compound material, such as gallium arsenide (GaAs) or gallium nitride (GaN), a ternary material, such as indium gallium arsenide (InGaAs), a quaternary material, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

The Miller indices form a notation system of the crystallographic planes in crystal lattices. The lattice planes may be indicated by three integers h, k, and l, which are the Miller indices for a plane (hkl) in the crystal. Each index denotes a plane orthogonal to a direction (h, k, l) in the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to l. For some crystals, negative numbers are used (written as a bar over the index number) and for some crystals, such as gallium nitride, more than three numbers may be desired to adequately describe the different crystallographic planes.

Once the wafer 100 has been processed as desired, the wafer 100 is divided up using dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, may depend on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access the die 106. The die 106 may also be directly accessed through wire bonding, probes, or other connections without mounting the die 106 into a separate package.

Figure 2:
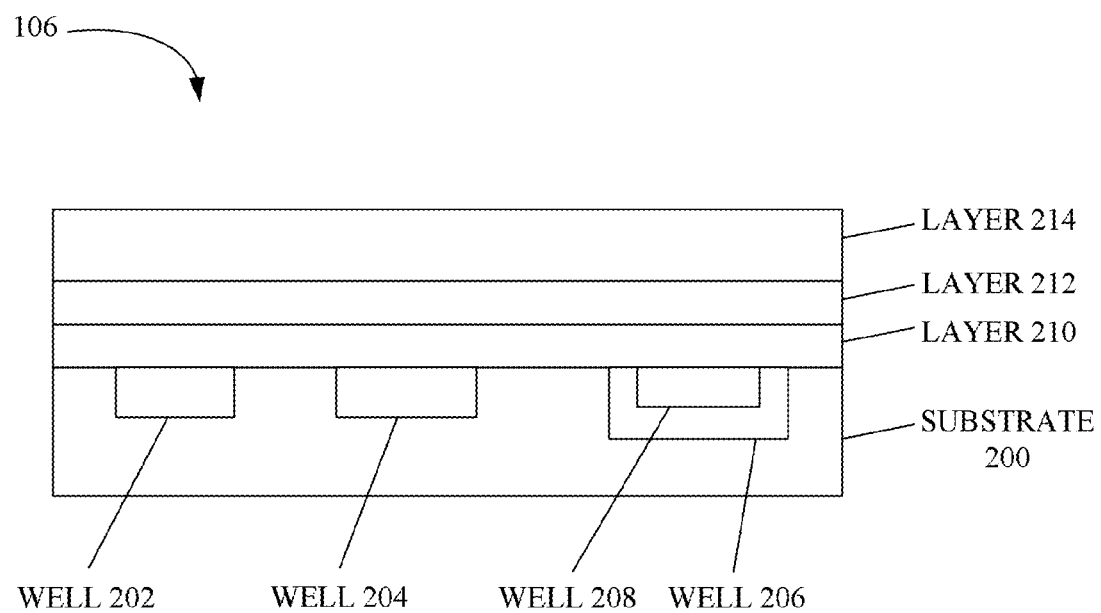
FIG. 2 illustrates a cross-sectional view of a die in accordance with an aspect of the present disclosure.

FIG. 2 illustrates a cross-sectional view of a die 106 in accordance with an aspect of the present disclosure. In the die 106, there may be a substrate 200, which may be a semiconductor material and/or may act as a mechanical support for electronic devices. The substrate 200 may be a doped semiconductor substrate, which has either electrons (designated n-type) or holes (designated p-type) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

A first layer 210, a second layer 212 and a third layer 214 may be added to the die 106. The first layer 210 may be, for example, an oxide or insulating layer that may isolate the wells 202-208 from each other or from other devices on the die 106. In such cases, the first layer 210 may be silicon dioxide, a polymer, a dielectric, or another electrically insulating layer. The first layer 210 may also be an interconnection layer, in which case it may comprise a conductive material such as copper, tungsten, aluminum, an alloy, or other conductive or metallic materials.

The second layer 212 may also be a dielectric or conductive layer, depending on the desired device characteristics and/or the materials used for the first layer 210, the second layer 212 and the third layer 214. The third layer 214 may be an encapsulating layer, which may protect the first layer 210 and the second layer 212, as well as the wells 202-208 and the substrate 200, from external forces. For example, and not by way of limitation, the third layer 214 may be a layer that protects the die 106 from mechanical damage, or the third layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the first layer 210, the second layer 212 and the third layer 214. For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the first layer 210, the second layer 212 and the third layer 214, and through selective removal, material selection, and dopant concentration of the substrate 200 and the wells 202-208, many different structures and electronic devices may be formed within the scope of the present disclosure.

Further, the substrate 200, the wells 202-208, and the first layer 210, the second layer 212 and the third layer 214 may be selectively removed or added through various processes. Chemical wet etching, chemical mechanical planarization (CMP), plasma etching, photoresist masking, damascene processes, and other methods may create the structures and devices of the various aspects of the present disclosure.

Figure 3:
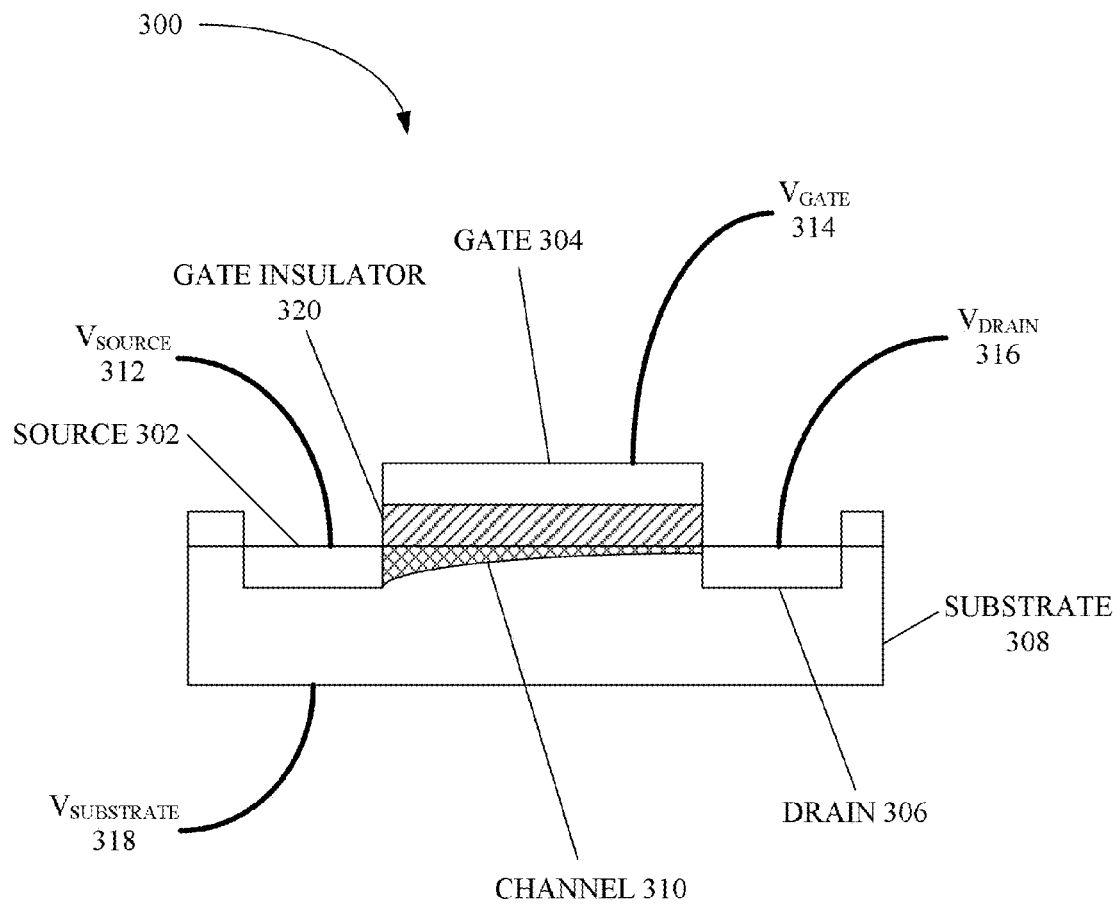
FIG. 3 illustrates a cross-sectional view of a metal-oxide-semiconductor field-effect transistor (MOSFET) device in an aspect of the present disclosure.
Figure 3:
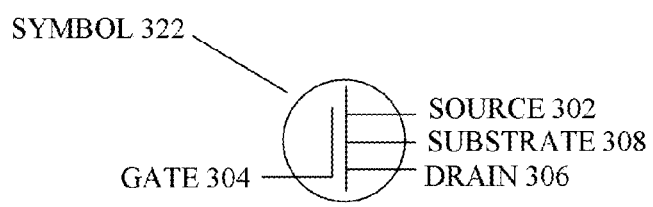

FIG. 3 illustrates a cross-sectional view of a metal-oxide-semiconductor field-effect transistor (MOSFET) device in an aspect of the present disclosure. A metal-oxide-semiconductor field-effect transistor (MOSFET) 300 may have four input terminals. The four inputs are a source 302, a gate 304, a drain 306, and a substrate 308. The source 302 and the drain 306 may be fabricated as the wells 202 and 204 in the substrate 308, or may be fabricated as areas above the substrate 308, or as part of other layers on the die 106 if desired. Such other structures may be a fin or other structure that protrudes from a surface of the substrate 308. Further, substrate 308 may be the substrate 200 on the die 106, but substrate 308 may also be one or more of the first layer 210, the second layer 212 and the third layer 214 that are coupled to the substrate 200.

The MOSFET device 300 is a unipolar device, as electrical current is produced by only one type of charge carrier (e.g., either electrons or holes) depending on the type of the MOSFET device 300. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314 or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing toward the gate 304 terminal.

The gate 304 may also be made of different materials. In some designs, the gate 304 is made from polycrystalline silicon, also referred to as polysilicon or poly, which is a conductive form of silicon. Although referred to as "poly" or "polysilicon" herein, metals, alloys, or other electrically conductive materials are contemplated as appropriate materials for the gate 304 as described in aspects of the present disclosure.

To interconnect to the MOSFET device 300, or to interconnect to other devices in the die 106 (e.g., semiconductor), interconnect traces or layers are used. These interconnect traces may be in one or more of the first layer 210, the second layer 212 and the third layer 214, or may be in other layers of the die 106.

Some interconnects in semiconductor products may be "unidirectional," in that the traces on a given interconnect level only travel in one direction. For example, one interconnect layer may have traces that run horizontally, and another interconnect layer may have traces that run vertically. The interconnect layers may be connected using vertical interconnections (e.g., vias) such that the traces from the interconnect layers may overlap each other and are only connected at the vertical connection sites.

When semiconductor devices are scaled to smaller geometries, different types of scaling are used so that the interconnect traces are also scaled to smaller sizes. This scaling may create problems within the interconnect layers because the resistance of the interconnect traces is inversely proportional to the cross-sectional area of the interconnect trace. As resistance increases, the performance of the overall circuit may change (e.g., degrade), which may interfere with proper operation of the circuit. As such, scaling the interconnect traces generally results in a design trade-off between performance of the circuit and the density of the traces that connect the underlying devices.

Design libraries may be used to create the overall circuit and to ensure the design of an overall circuit (e.g., a memory or processor). These design libraries have pre-organized groups of devices, which may be called cells, where each cell has a specified function such as a memory gate, a group of memory gates, an electromagnetic pulse (EMP) protection device, and other devices.

Circuit designers place various numbers and types of cells together to create the overall circuit. Depending on the cell function, the cell may have different dimensions. One of these dimensions may be referred to as the cell height. The cell height may be dependent upon any number of variables, including the number and types of devices, the overall geometry, and/or the function of the cell, among other things.

Figure 4:
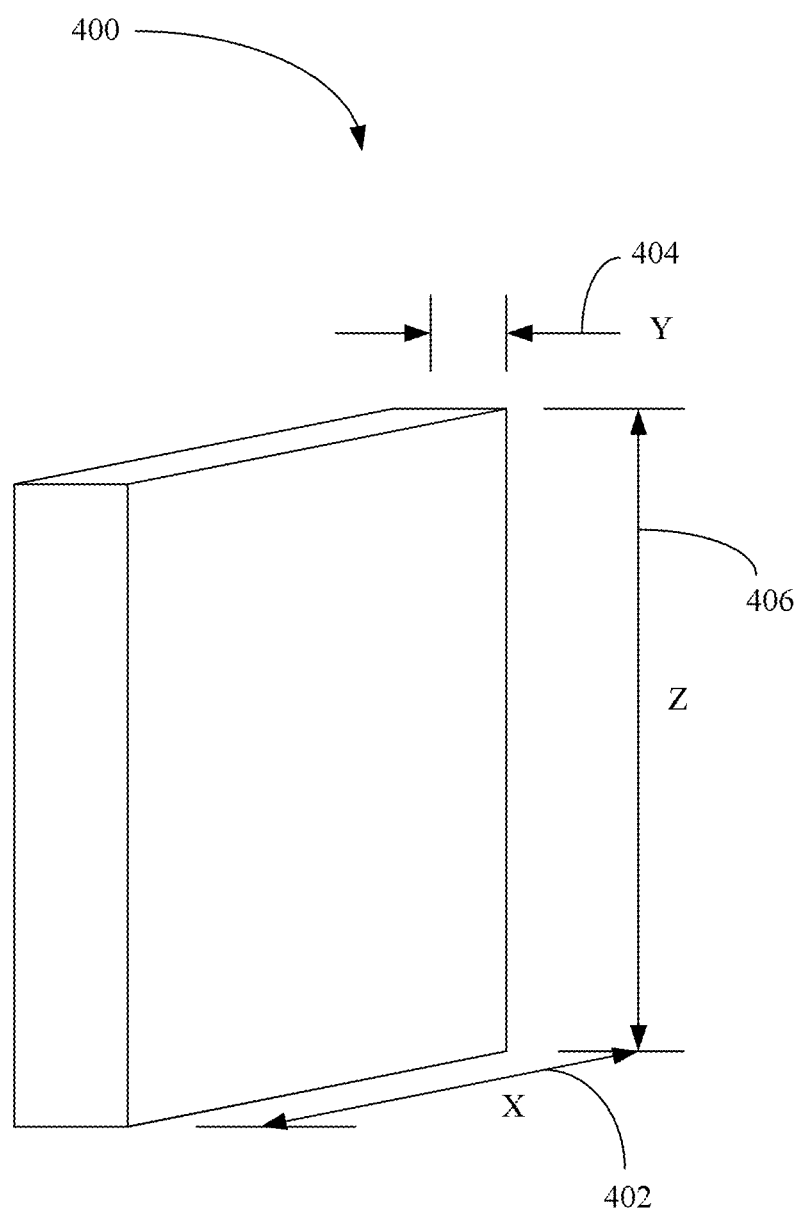
FIG. 4 illustrates a vertical structure in accordance with an aspect of the present disclosure.

FIG. 4 illustrates a vertical structure in accordance with an aspect of the present disclosure. In a half-node process migration of a vertical device 400 (also referred to as a vertical structure), the x dimension 402 and the y dimension 404 geometries of the vertical device 400 are reduced. The x dimension 402 and the y dimension 404 may be reduced to 0.9 (or 90%) of the original values. The dimensions may also be reduced to other values, or to different percentages than each other, without departing from the scope of the present disclosure. This reduction in x dimension 402 and the y dimension 404 reduces the size of the die 106 by approximately twenty percent (20%). Advantageously, this reduction in size also reduces a cost of the die 106 by a similar amount.

In planar MOSFET technology, a device width (e.g., the y dimension 404) would scale by 0.9, while the gate length (Lg) (e.g., the x dimension 402) remains constant. This enables the use of the same device computer model to accurately model the half-node scaled layout. Computer models for devices also model the entire circuit. These models may be employed to simulate the circuit behavior in a computer program, such as a program known as Simulation Program with Integrated Circuit Emphasis (SPICE). The device characteristics are modeled and compared to actual device characteristics to validate the model after prototype device production and debugging.

With the vertical device 400 shown in FIG. 4, however, when the vertical dimension (e.g., the z dimension 406) is scaled in a half-node process migration, the SPICE device model no longer accurately models the behavior of the vertical device 400. As such, half-node scaling of the vertical device 400 (e.g., a FinFETs) results in different circuit behavior, which may lead to a redesign of the circuit. This reduces the desirability of half-node scaling for vertical devices, and may involve longer times between device improvements until full-node technology migration is available.

Another advantage of half-node scaling is that the lithography processing for the overall circuit remains the same for reduced size devices and features. Portions of the original design, however, may already be at the limits of the original lithography. For example, interconnect trace widths may be at a forty-two (42) nanometer pitch in the original design, which is the limit of the original technology node. Reducing the interconnect trace pitch to thirty-eight (38) nanometers (or by 90% of the original pitch) is not possible in the original lithographic process, so half-node scaling may involve more complex patterning processes for such a design.

One aspect of the present disclosure maintains a vertical structure (e.g., fin) height (e.g., the z dimension 406) during half-node scaling of a scaled fin width/length (also referred to as fin pitch and shown as the x dimension 402 and the y dimension 404). In vertical devices, such as FinFETs, scaling the fin height may involve a different SPICE device model. Scaling of the fin height also changes the fin profile, and thus changes device behavior. Maintaining fin height at half-node migration also provides a chance to increase a drive current strength at a reduced die area in the half-node design.

With respect to geometrical features that are already at the limits of the lithographic process, one aspect of the present disclosure uses a scaled wavelength when migrating to the half-node design. This aspect of the present disclosure maintains the layout design, and may simplify the process that creates the circuit. For example, the present disclosure, in an aspect, may use an extreme ultraviolet (EUV) wavelength (e.g., $\lambda=13.5$ nanometer) light source for photoresist exposure when half-node scaling a device, instead of an argon fluoride (ArF) wavelength (e.g., $\lambda=193$ nanometer) light source. Reducing the wavelength increases the precision of the masking properties of the photoresist layers.

Further, EUV photoresist exposure may allow for those features that employ multiple patterning steps (e.g., self-aligned double patterning (SADP), self-aligned quadruple patterning (SAQP)) to reduce to the number of patterning steps. Because of the scaled wavelength, the technology node can scale at simpler patterning processes (such as a single exposure step instead of a multiple patterning step), making the overall process simpler. Such advantages of the present disclosure can improve yield and reduce cost.

One aspect of the present disclosure may also reduce the number of fabrication steps or processes for the circuit layout in the half-node scaled circuit layout. Multiple wavelengths may expose different patterns of photoresist, even within a single layer of the integrated circuit of the half-node scaled device. The reduced-area patterns of the half-node scaled device may reside in any layer, including a middle of line layer and a back end of line layer.

Figure 6:
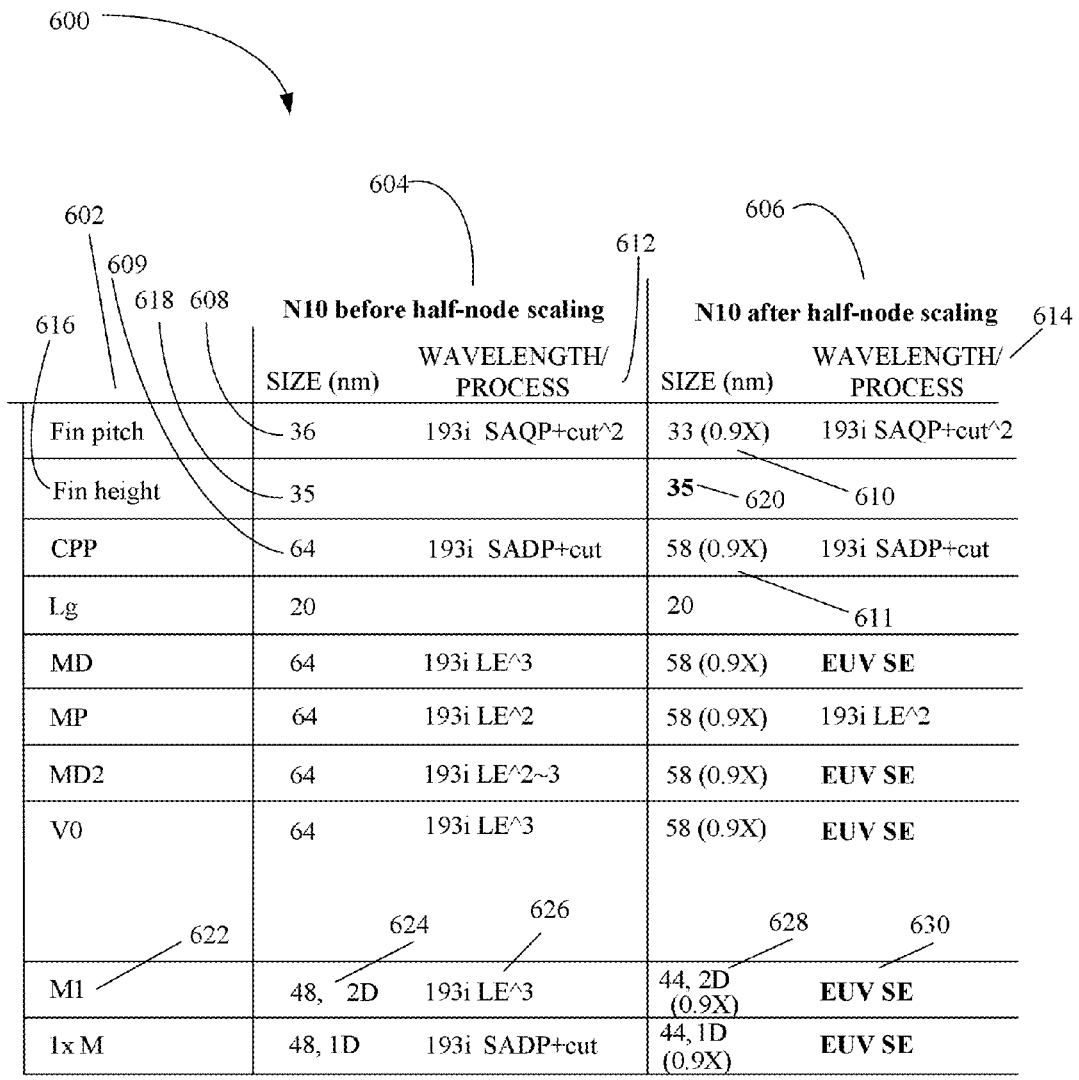

FIGS. 5 and 6 illustrate half-node scaled device geometries in various aspects of the present disclosure. FIG. 5 illustrates a graph 500 that lists several of the geometric features 502 for a base technology node 504. The half-node scaling 506 of the base technology node 504 for the geometric features 502 is also shown. In the base technology node 504, the fin pitch size 508 and gate pitch (cut poly pitch, or CPP) 509 are shown as thirty-two (32) and sixty-four (64) nanometers, respectively. In the half-node scaling 506, the fin pitch size 510 is reduced to twenty-nine (29) nanometers and the gate pitch 511 is reduced to fifty-eight (58) nanometers. The wavelength and processes 512 in the base technology node 504 to fabricate the fin pitch size 508 and the fin pitch size 510 as well as the gate pitch 509 and the gate pitch 511 are the same wavelength and processes 514 used in the half-node scaling 506.

For one of the geometric features 502 of the fin height 516, the value 518 in the base technology node 504 is the same as the value 520 in the half-node scaling 506. As such, some of the geometric features 502 may be selectively scaled, and other ones of the geometric features 502 may not be scaled during the half-node scaling of the device.

Further, some of the wavelengths and processes 512 may be changed between the base technology node 504 and the half-node scaling 506. For example, for one of the geometric features 502 of metal to diffusion layer 1 (MD1) 522, the size 524 of the base technology node 504 of the MD1 522 is sixty-four (64) nanometers. This geometric size is created using a wavelength/process 526 employing a one hundred ninety-three (193) (64) nanometer wavelength source for photoresist exposure and a litho-etch-litho-etch-litho-etch (LE^3) process. In the half-node scaling 506, the size 528 is reduced to fifty-eight (58) nanometer, and the wavelength/process 530 employs an extreme UV light source for photoresist exposure with a single etch (SE) process. The present disclosure employs different light sources to expose different layers within the overall circuit design. This aspect of the present disclosure may also employ different processes in the half-node scaling 506 than in the base technology node 504 from which the half-node scaling 506 derives.

FIG. 6 illustrates a graph 600 that lists several of the geometric features 602 for a base technology node 604. The half-node scaling 606 of the base technology node 604 for the geometric features 602 is also shown. In the base technology node 604, the fin pitch size 608 and gate pitch 609 are shown as thirty-six (36) and sixty-four (64) nanometers, respectively. In the half-node scaling 606, the fin pitch size 610 is reduced to thirty-three (33) nanometers and the gate pitch 611 is reduced to fifty-eight (58) nanometers. The wavelength and processes 612 in the base technology node 604 to fabricate the fin pitch size 608 and the fin pitch size 610 as well as the gate pitch 609 and gate pitch 611 are the same wavelength and process 614 as in the half-node scaling 606. For one of the geometric features 602 of the fin height 616, the value 618 in the base technology node 604 is the same as the value 620 in the half-node scaling 606.

As in the example of FIG. 5, some of the wavelengths and processes 612 may be changed between the base technology node 604 and the half-node scaling 606. For example, for one of the geometric features 602 of the first conductive layer (M1) 622, the base technology node 604 size 624 of the M1 622 is forty-eight (48) nanometers in two dimensions (2D). This geometric size is created using wavelength/process 626 employing a 193 nanometer wavelength source for photoresist exposure and a litho-etch-litho-etch-litho-etch (LE^3) process. Ones of the geometric features 602 that are reduced sized may reside in any single layer, or in multiple layers. Further, the reduced size geometric features may reside in any one or more of the middle of line layers, back end of line layers, or any combination of these layers.

In the half-node scaling 606, the size 628 is reduced to forty-four (44) nanometers, and the wavelength/process 630 employs an extreme UV light source for photoresist exposure with a single etch (SE) process.

Figure 7:
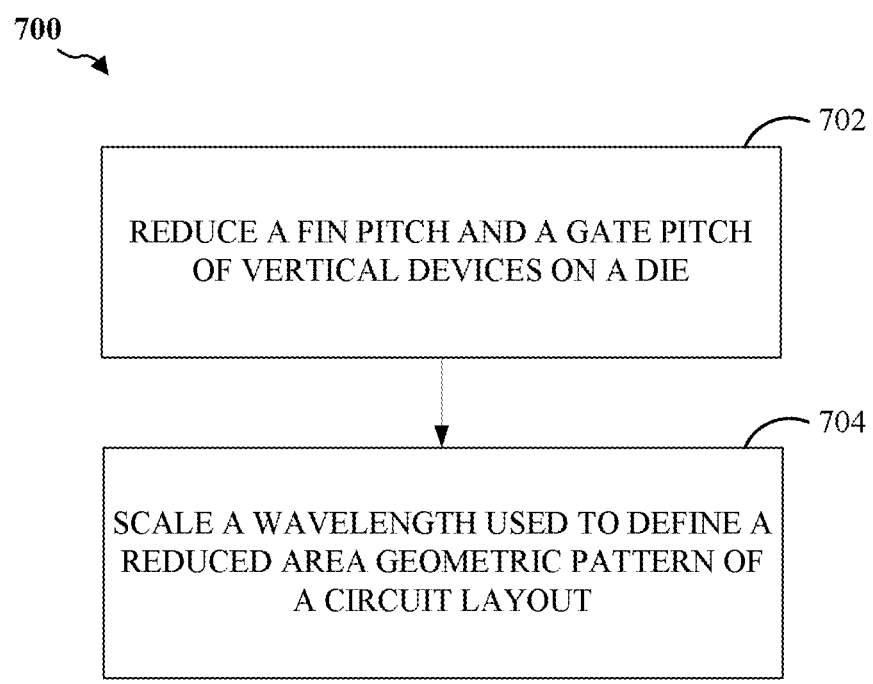
FIG. 7 is a process flow diagram illustrating a process of routing conductive layers within an integrated circuit according to an aspect of the present disclosure.

FIG. 7 is a process flow diagram illustrating a method 700 for designing conductive interconnects according to an aspect of the present disclosure. In block 702 a fin pitch and a gate pitch of the vertical devices on a die are reduced. In block 704, a wavelength used to define at least one reduced area geometric pattern of the circuit layout is scaled. For example, as shown in FIG. 5, the fin pitch is reduced from 32 to 29 nm, the contacted poly pitch (CPP) (i.e., gate pitch) is reduced from 64 to 58 nm, and the wavelength to define layer MD1 522 is scaled from 193 nm to extreme UV (EUV.)

A half-node scaled circuit layout on a die in accordance with an aspect of the present disclosure includes a plurality of vertical devices having a first fin pitch and a first gate pitch. Such devices may be, for example, those devices having characteristics of the base technology node 504 as shown in FIG. 5. The half-node scaled circuit layout also includes means for selectively conducting current within a reduced area geometric pattern in the half-node scaled circuit layout. Such selective current means may be, for example, devices described in the half-node scaling 506 as shown in FIG. 5. In another aspect, the aforementioned means may be any module or any apparatus configured to perform the functions recited by the aforementioned means.

Figure 8:
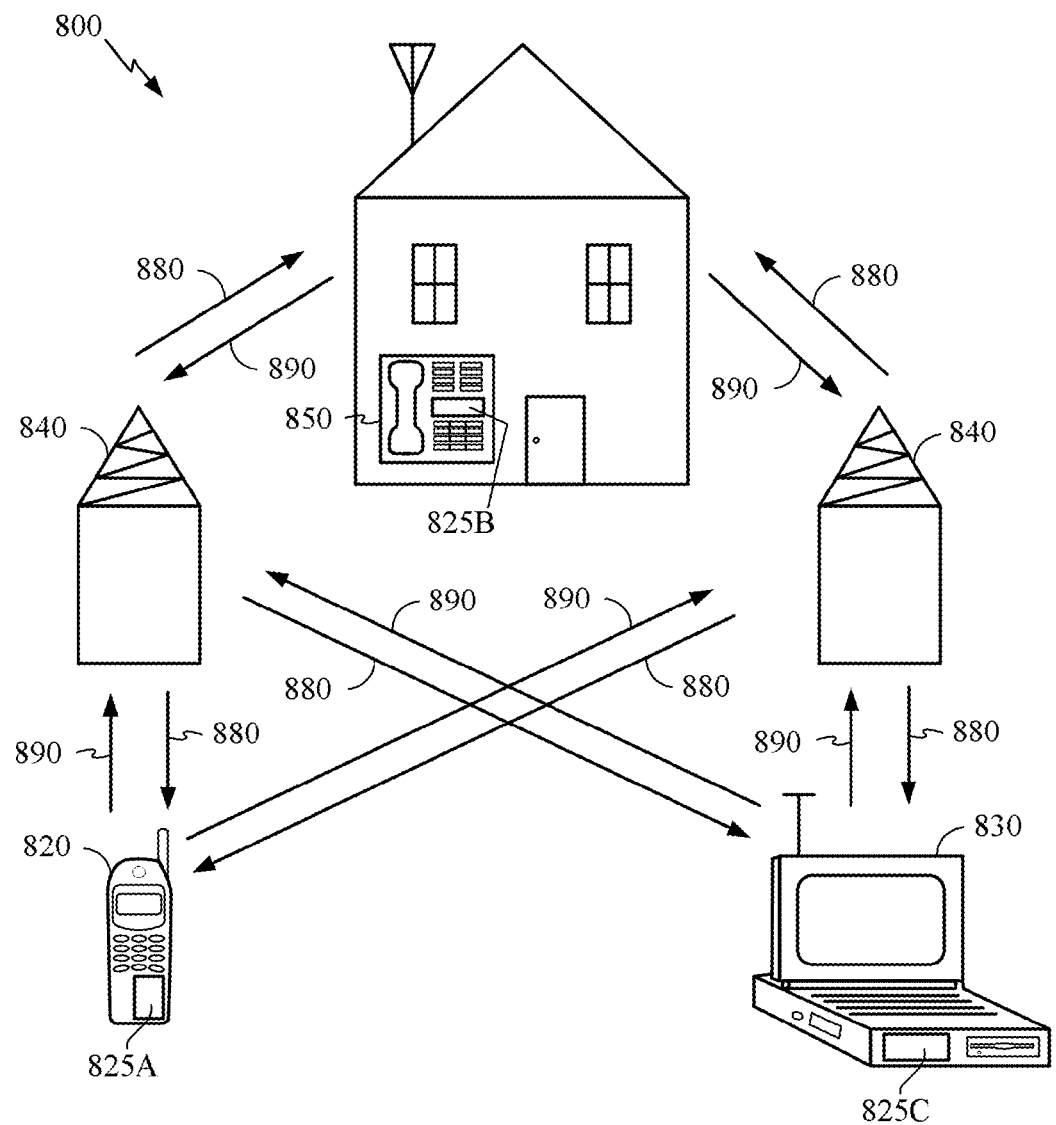
FIG. 8 is a block diagram showing an exemplary wireless communication system in which a configuration of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B fabricated as discussed above. It will be recognized that other devices may also include the disclosed devices, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication systems (PCS) unit, a portable data unit such as a personal data assistant, a GPS enabled devices, a navigation device, a set top box, a music player, a video players, an entertainment unit, a fixed location data unit, such as meter reading equipment, or other device that stores or retrieves data or computer instructions, or a combination thereof. Although FIG. 8 illustrates remote units according to the aspects of the disclosure, the disclosure is not limited to these exemplary illustrated units. Aspects of the disclosure may be suitably employed in many devices, which include the devices fabricated as described above.

Figure 9:
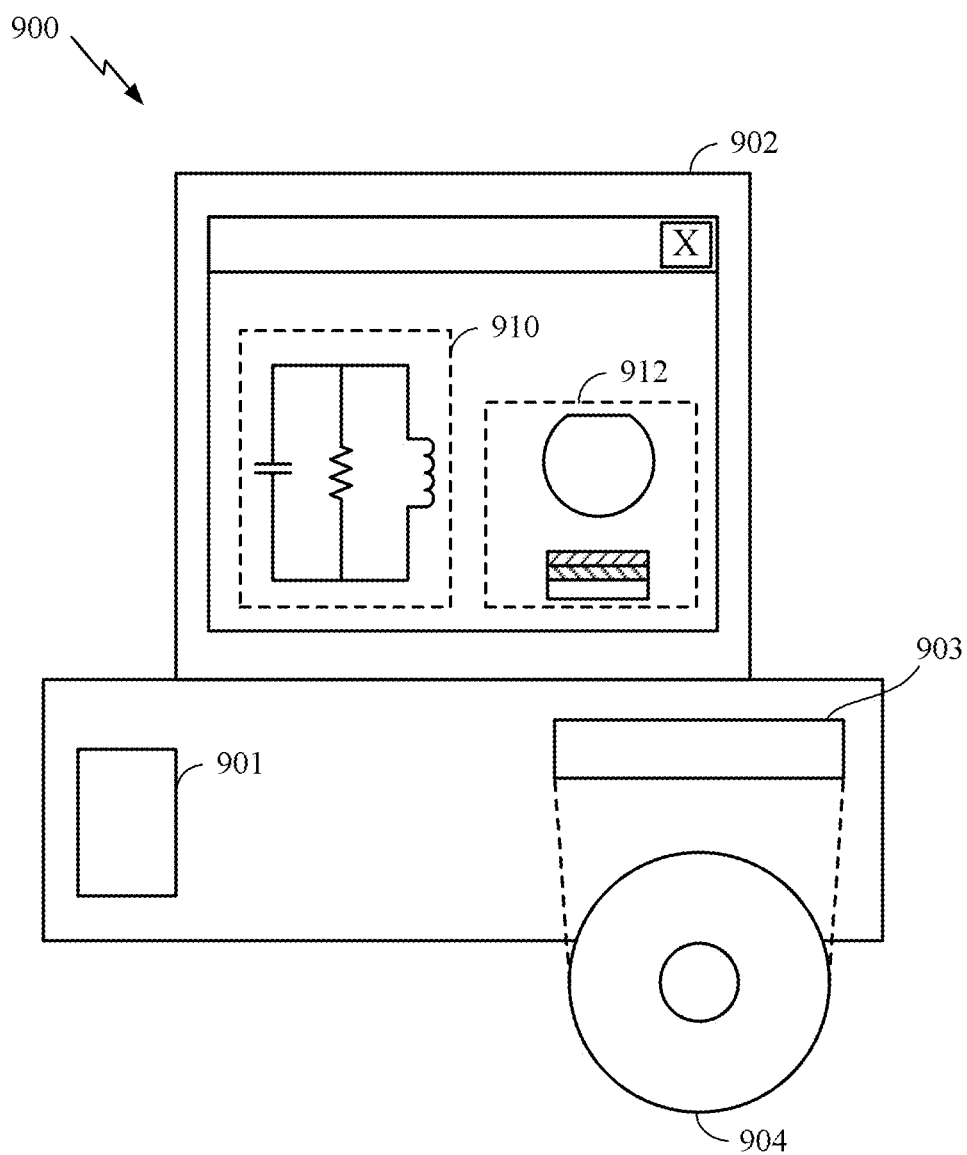
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the devices fabricated as described above. A design workstation 900 includes a hard disk 901 containing operating system software, support files, and design software such as Cadence or OrCAD. The design workstation 900 also includes a display 902 to facilitate design of a circuit 910 or a semiconductor component 912 such as a device in accordance with an aspect of the present disclosure. A storage medium 904 is provided for tangibly storing the design of the circuit 910 or the semiconductor component 912. The design of the circuit 910 or the semiconductor component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the semiconductor component 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below", "top" and "bottom", or "vertical" and "horizontal" are used with respect to a substrate or electronic device. Of course, if the substrate or electronic device is inverted, above becomes below, top becomes bottom, vertical becomes horizontal, and vice versa. Additionally, if oriented sideways, above and below, top and bottom, or vertical and horizontal may refer to sides of a substrate or electronic device.

Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core), or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method for half-node scaling a circuit layout including a plurality of vertical devices on a die, comprising:
reducing a fin pitch and a gate pitch of the plurality of vertical devices on the die by a haft-node scaling factor using a computing system;
maintaining a height of the plurality of vertical devices on the die; and
defining at least one reduced area geometric pattern of the circuit layout in at least one of a middle of line layer and a back end of line layer.

2. The method of claim 1, further comprising reducing a number of processes for fabricating the circuit layout in a half-node scaled circuit layout.

3. The method of claim 1, further comprising defining the at least one reduced area geometric pattern of the circuit layout with a plurality of wavelengths.

4. The method of claim 1, in which the at least one reduced area geometric pattern of the circuit layout is disposed on a single layer within the circuit layout.

5. The method of claim 1, in which the circuit layout is integrated into a mobile phone, a set top box, a music player, a video player, an entertainment unit, a navigation device, a computer, a hand-held personal communication systems (PCS) unit, a portable data unit, and/or a fixed location data unit.

6. The method of claim 1, in which defining the at least one reduced area geometric pattern of the circuit layout comprises selecting a wavelength.

7. A half-node scaled circuit layout on a die, comprising:
a plurality of vertical devices having a first fin pitch and a first gate pitch reduced by a scaling factor, in which a height of the plurality of vertical devices on the die is maintained; and
means disposed in at least one of a middle of line layer and a back end of line layer for selectively conducting current within a reduced area geometric pattern in the half-node scaled circuit layout.

8. The half-node scaled circuit layout of claim 7, in which the conducting means is fabricated with a plurality of wavelengths.

9. The half-node scaled circuit layout of claim 7, in which the conducting means is disposed on a single layer within the half-node scaled circuit layout.

10. The half-node scaled circuit layout of claim 7, integrated into a mobile phone, a set top box, a music player, a video player, an entertainment unit, a navigation device, a computer, a hand-held personal communication systems (PCS) unit, a portable data unit, and/or a fixed location data unit.

11. A computer program product for fabricating a half-node scaled circuit layout having a plurality of vertical devices on a die, comprising:
a non-transitory computer readable medium having encoded thereon program code, the program code comprising:
program code to reduce a fin pitch and a gate pitch of the plurality of vertical devices on the die by a scaling factor;
program code to maintain a height of the plurality of vertical devices on the die; and
program code to define at least one reduced area geometric pattern of the half-node scaled circuit layout in at least one of a middle of line layer and a back end of line layer.

12. The computer program product of claim 11, further comprising program code to reduce a number of processes for fabricating the half-node scaled circuit layout.

13. The computer program product of claim 11, further comprising program code to define the at least one reduced area geometric pattern of the half-node scaled circuit layout with a plurality of wavelengths.

14. The computer program product of claim 11, further comprising program code to dispose the at least one reduced area geometric pattern of the half-node scaled circuit layout on a single layer.

15. The computer program product of claim 11, in which the half-node scaled circuit layout is integrated into a mobile phone, a set top box, a music player, a video player, an entertainment unit, a navigation device, a computer, a hand-held personal communication systems (PCS) unit, a portable data unit, and/or a fixed location data unit.

16. The computer program product of claim 11, further comprising program code to select a wavelength to define the at least one reduced area geometric pattern of the half-node scaled circuit layout.

17. A half-node scaled circuit layout on a die, comprising:
a plurality of vertical devices having a first fin pitch and a first gate pitch reduced by a scaling factor, in which a height of the plurality of vertical devices on the die is maintained; and
at least one device within a reduced area geometric pattern in the half-node scaled circuit layout disposed in at least one of a middle of line layer and a back end of line layer.

18. The half-node scaled circuit layout of claim 17, in which the at least one device is fabricated with a plurality of wavelengths.

19. The half-node scaled circuit layout of claim 17, in which the at least one device is disposed on a single layer within the half-node scaled circuit layout.

20. The half-node scaled circuit layout of claim 17, integrated into a mobile phone, a set top box, a music player, a video player, an entertainment unit, a navigation device, a computer, a hand-held personal communication systems (PCS) unit, a portable data unit, and/or a fixed location data unit.

* * * * *